(12) United States Patent
Chettuvetty et al.

(10) Patent No.: US 11,586,896 B2
(45) Date of Patent: Feb. 21, 2023

(54) IN-MEMORY COMPUTING ARCHITECTURE AND METHODS FOR PERFORMING MAC OPERATIONS

(71) Applicant: Infineon Technologies LLC, San Jose, CA (US)

(72) Inventors: Ramesh Chettuvetty, Colorado Springs, CO (US); Vijay Raghavan, Colorado Springs, CO (US); Hans Van Antwerpen, Mountain View, CA (US)

(73) Assignee: INFINEON TECHNOLOGIES LLC, San Jose, CA (US)

( * ) Notice: Subject to any disclaimer, the term of this patent is extended or adjusted under 35 U.S.C. 154(b) by 166 days.

(21) Appl. No.: 16/908,210

(22) Filed: Jun. 22, 2020

(65) Prior Publication Data
US 2021/0271959 A1   Sep. 2, 2021

Related U.S. Application Data

(60) Provisional application No. 62/983,866, filed on Mar. 2, 2020.

(51) Int. Cl.
*G06N 3/063*      (2006.01)
*G06N 3/04*       (2023.01)
(Continued)

(52) U.S. Cl.
CPC ............... *G06N 3/063* (2013.01); *G06F 5/01* (2013.01); *G06F 7/5443* (2013.01); *G06N 3/04* (2013.01);
(Continued)

(58) Field of Classification Search
CPC .. G06N 3/00; G06N 3/02; G06N 3/06; G06N 3/063; G06N 3/0635; G06N 3/04; G06F 2207/4824
See application file for complete search history.

(56) References Cited

U.S. PATENT DOCUMENTS 6,859,872 B1   2/2005 Anderson et al.
6,868,009 B1   3/2005 Hung et al.
(Continued)

FOREIGN PATENT DOCUMENTS

WO   WO-2022015967 A1 *  1/2022   ............... G11C 7/06

OTHER PUBLICATIONS

International Search Report and Written Opinion of the International Searching Authority for International Application No. PCT US2021/019760, dated May 6, 2021; 17 pages.
(Continued)

*Primary Examiner* — Seokjin Kim

(57) ABSTRACT

In-memory computing architectures and methods of performing multiply-and-accumulate operations are provided. The method includes sequentially shifting bits of first input bytes into each row in an array of memory cells arranged in rows and columns. Each memory cell is activated based on the bit to produce a bit-line current from each activated memory cell in a column on a shared bit-line proportional to a product of the bit and a weight stored therein. Charges produced by a sum of the bit-line currents in a column are accumulated in first charge-storage banks coupled to a shared bit-line in each of the columns. Concurrently, charges from second input bytes accumulated in second charge-storage banks previously coupled to the columns are sequentially converted into output bytes. The charge-storage banks are exchanged after the first input bytes have been accumulated and the charges from the second input bytes converted. The method then repeats.

20 Claims, 10 Drawing Sheets

(51) Int. Cl.
*G06F 7/544* (2006.01)
*G11C 11/54* (2006.01)
*G11C 11/56* (2006.01)
*G06F 5/01* (2006.01)
*H03M 1/38* (2006.01)

(52) U.S. Cl.
CPC .............. *G11C 11/54* (2013.01); *G11C 11/56* (2013.01); *H03M 1/38* (2013.01)

(56) References Cited

U.S. PATENT DOCUMENTS

| | | |
|---|---|---|
| 10,825,509 B2* | 11/2020 | Sumbul ................ G11C 7/1006 |
| 2009/0207642 A1 | 8/2009 | Shimano et al. |
| 2010/0172180 A1 | 7/2010 | Paley et al. |
| 2016/0005477 A1 | 1/2016 | Wu et al. |
| 2020/0042287 A1* | 2/2020 | Chalamalasetti .... G06N 3/0635 |
| 2021/0110235 A1* | 4/2021 | Hoang ..................... G06N 3/04 |
| 2021/0125045 A1* | 4/2021 | Jang .................... H01L 25/0652 |
| 2021/0192324 A1* | 6/2021 | Srivastava ............... G06N 3/08 |
| 2021/0192325 A1* | 6/2021 | Hoang ............... G11C 13/0028 |
| 2021/0240442 A1* | 8/2021 | Srivastava ............... G11C 7/16 |
| 2021/0256364 A1* | 8/2021 | Wang ................... G11C 11/407 |
| 2021/0327474 A1* | 10/2021 | Seok .................... G11C 11/412 |
| 2022/0019408 A1* | 1/2022 | Kim ....................... G06N 3/063 |

OTHER PUBLICATIONS

Jia et al. "A Microprocessor Implemented in 65nm CMOS with Configurable and Bit-Scalable Accelerator for Programmable in-Memory Computing" Nov. 9, 2018, 11 pages.

* cited by examiner

IN-MEMORY COMPUTING ARCHITECTURE AND METHODS FOR PERFORMING MAC OPERATIONS

CROSS-REFERENCE TO RELATED APPLICATIONS

This application claims the benefit of priority under 35 U.S.C. 119(e) to U.S. Provisional Patent Application Ser. No. 62/983,866, filed Mar. 2, 2020, which is incorporated by reference herein in its entirety.

TECHNICAL FIELD

This disclosure relates generally to In-Memory Computing (IMC), and more particularly to IMC architectures and methods of operating the same to perform Multiply and Accumulate (MAC) operations.

BACKGROUND

In-memory computing (IMC) or processing is a developing technology for performing computation of data in-memory rather than fetching data from memory and performing computations in a separate computational element in the processor. The Von Neumann compute architecture approach to Artificial Intelligence (AI) requires continuous external memory access to fetch stored weights used in neural networks, data and to store intermediate results into the computational elements. System power efficiency is limited by data movement between this external memory and the processing structure. IMC greatly improves data processing speed and power efficiency of computations since data stored in memory is not moved back and forth to processing elements outside the memory. IMC is proving to be particularly useful in high speed, neural network architectures for power sensitive AI applications.

Current IMC technologies use predominantly digital implementations, which while providing some improvement in data processing speeds can suffer from significant power efficiency issues. In particular, IMC implementations used in AI applications lose power efficiency due to the latencies associated with the conversion of an input digital byte stream to an analog equivalent representation prior to accessing memory rows for a multiply-accumulate (MAC) operation in analog. Previous attempts at providing analog IMC solutions rely on a digital-to-analog converter (DAC) to convert the input data byte stream into analog for each row in a memory array or matrix, and in turn using the DAC output to drive memory cells that store weights of a data matrix. Thus, current analog IMC implementations have significant power overheads due to the DACs used to convert the input data byte streams to analog and also due to the latencies involved in generating the output analog voltage from the input data byte stream.

Accordingly, there is a need for an analog IMC architecture and methods of operating the same to perform Multiply and Accumulate (MAC) operations that is capable of converting an input digital byte stream to analog at high speed and with high power efficiencies.

SUMMARY

An in-memory computing (IMC) architecture and methods of performing multiply-and-accumulate (MAC) operations are provided. The IMC architecture and methods of operating the same to perform MAC operations are particularly useful in or with a hardware accelerator, such as those used in artificial intelligence (AI) apparatus.

The IMC architecture includes a MAC core including an array of memory cells arranged in rows and columns, each memory cell including a multilevel, non-volatile memory (NVM) device, and each column including a shared bit-line connecting NVM devices in the column. A plurality of registers each coupled to one row of the array are configured to sequentially shift bits of a first input byte into the row to activate the NVM devices based on a state of the bit, and to produce a weighted bit-line current from each activated NVM device proportional to a product of the bit and a weight stored in the NVM device. A plurality of first charge-storage banks, each coupled to the shared bit-line in one of the columns and configured receive a sum of weighted bit-line currents and to accumulate for each bit of the input bytes charge produced by the sum of weighted bit-line currents. The MAC core further includes plurality of second charge-storage banks coupled to a number of analog-to-digital converters (ADCs), each of the second charge-storage banks configured to concurrent with the shifting and accumulating, to provide scaled voltages for each bit of previously received second input bytes to the ADC for conversion into an output byte. A controller coupled to the plurality of first and second charge-storage banks is configured to switch or exchange the first charge-storage bank with the second charge-storage bank after each bit of the number of first input bytes has been accumulated in the first charge-storage bank and the charges in the second charge-storage bank have been converted.

A method of performing a MAC operation using the above architecture includes coupling each of a number of first input bytes stored in the registers to one of the plurality of rows in an array, sequentially shifting bits of the first input bytes into each memory cell in each row; and for each bit multiplying the bit with the weight stored in each memory cell, by activating each memory cell based on a state of the bit to produce a weighted bit-line current from each activated memory cell proportional to a product of the bit and the weight stored therein. Charges produced by a sum of the weighted bit-line currents from each activated memory cell in the column are accumulated in the first charge-storage banks, each coupled to the shared bit-line in one of the columns. Generally, the method further includes, concurrently with the shifting, multiplying, and accumulating in the first charge-storage banks, converting into an output byte charges produced by a sum of weighted bit-line currents from a number of second input bytes previously accumulated in the second charge-storage banks using the number of ADCs, and exchanging the first charge-storage bank with the second after each bit of the first input bytes has been accumulated and the charges in the second charge-storage bank have been converted.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

DETAILED DESCRIPTION

An In-Memory Computing (IMC) architecture and methods of operating the same to quickly and efficiently perform multiply-and-accumulate operations using the same are provided. The IMC architecture and methods of the present disclosure are particularly useful in or with hardware accelerator including a number of neural engines cores, such as those used in artificial intelligence (AI) apparatus.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

Figure 1A:
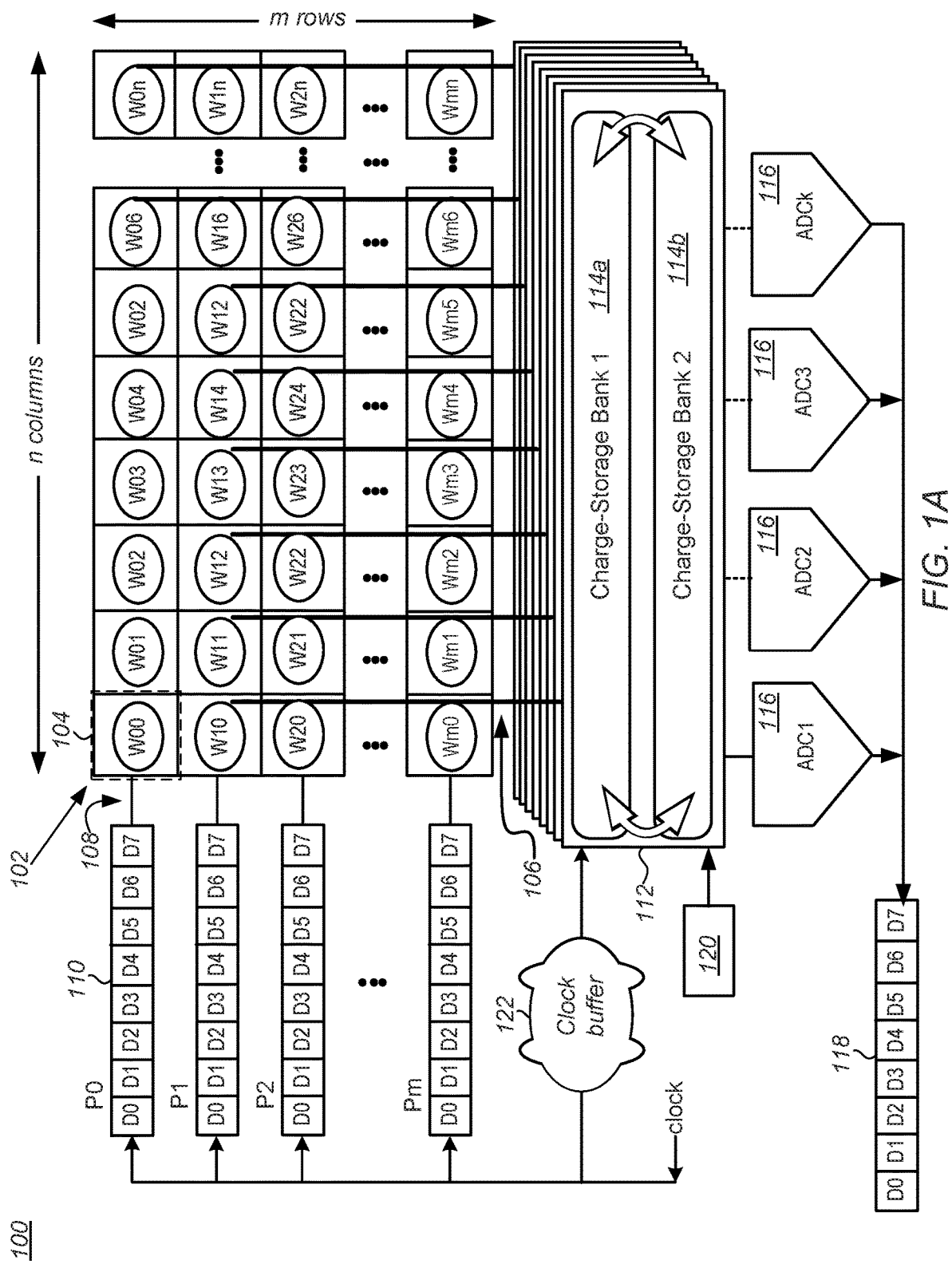
FIG. 1A is a schematic block diagram of an embodiment of an analog Multiply and Accumulate (MAC) core including a memory array, multiple charge-storage banks and analog to digital converters (ADC) to eliminate latency and improve efficiency in performing MAC operations.
Figure 1B:
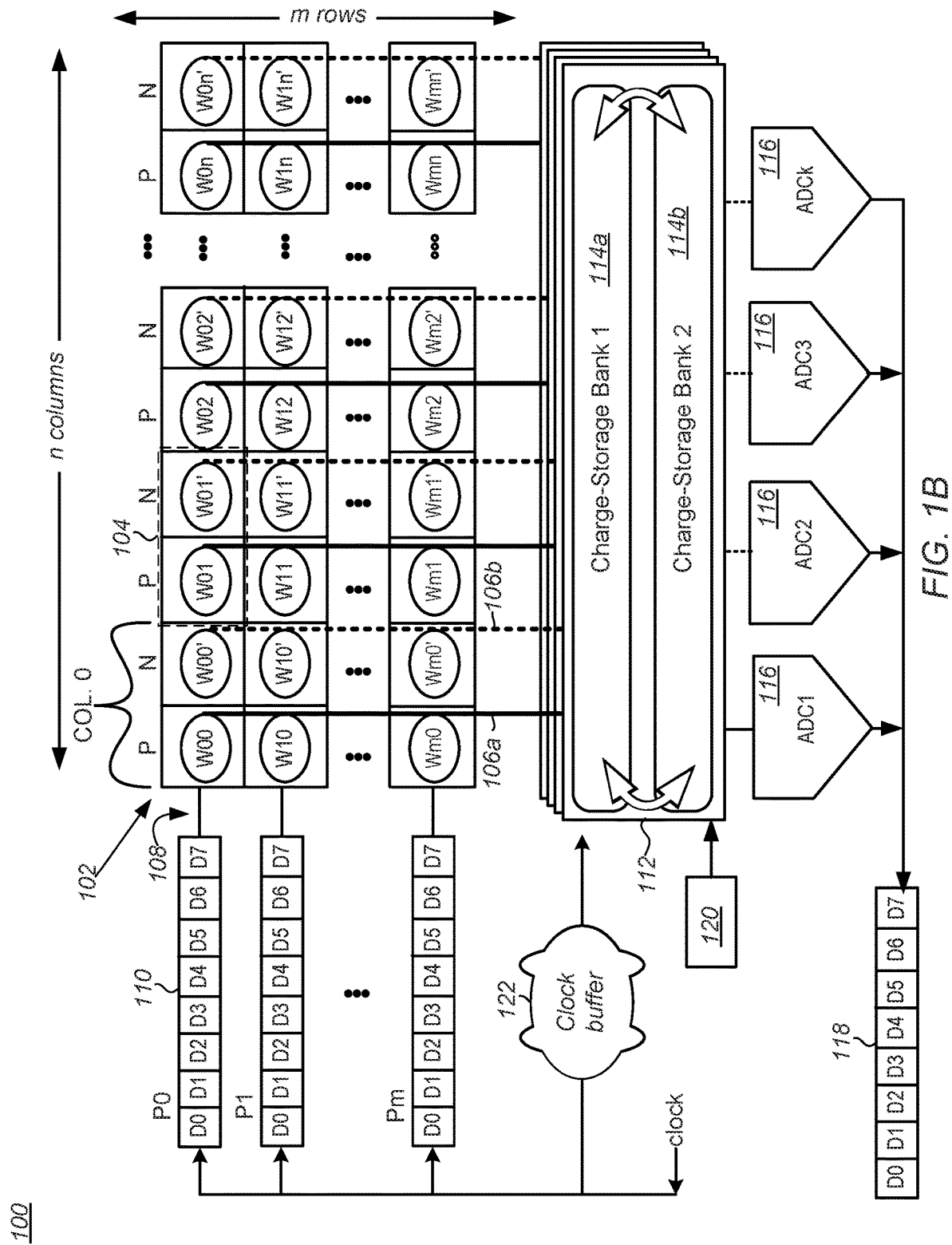
FIG. 1B is a schematic block diagram of another embodiment of a MAC core in which each memory cell in the memory array includes two non-volatile memory (NVM) cells, each including one or more NVM devices.

FIGS. 1A and 1B are schematic block diagrams illustrating embodiments of an analog Multiply and Accumulate (MAC) engine or core 100 suitable for use in hardware accelerator in an artificial intelligence (AI) apparatus or system to eliminate latency and improve efficiency in performing MAC operations.

Referring to FIG. 1A, in one embodiment the MAC core 100 includes a memory array or array 102 of memory units or cells 104, each having a programmed value or weight (indicated in FIG. 1A by ellipses W00, W01, W10 . . . etc.) stored therein, and arranged in a number (m) of rows and a number (n) of columns, in which each memory cell in a column is coupled to a shared bit-line 106, and each memory cell in a row is coupled to a shared wordline 108. Although in the embodiment shown the memory array 102 is a 4 by 8 array, including four rows and eight columns, it will understood that the memory array can alternatively include any number of rows and columns, including embodiments having fewer rows or columns than that shown. The MAC core 100 further includes multiple registers 110, generally at least one register for each row in the memory array 102, and capable of storing a multibit input data word or byte. Each register 110 is coupled to one row of the memory array 102 through the shared word line, and is configured to sequentially shift bits of a first input data byte, D0 through D7 in the embodiment shown, into a row in response to a clock signal to activate the memory cells 104 in the row based on a state of the shifted bit to produce from each activated memory cell in a column a weighted bit-line current on the shared bit-line of the column proportional to a product of the bit multiplied by the weight stored therein.

The MAC core 100 further includes multiple accumulators 112 each coupled to the shared bit-line in one of the columns, and each including a first charge-storage bank 114a switchably connected to the shared bit-line 106 and configured receive a sum of weighted bit-line currents from activated memory cells 104 in the column, and to accumulate for each bit of the first input data bytes a scaled charge produced by a sum of weighted bit-line currents. Each of the accumulators 112 further includes a second charge-storage bank 114b coupled to a number of analog-to-digital converters (ADCs 116), each of the second charge-storage banks configured to, in response to clock signals and concurrent with the shifting of bits into each row and accumulating a scaled charge in the first charge-storage banks 114a, provide accumulated voltages for each bit-line of a previously received second input data byte to the ADCs 116 for conversion into digital bits of an output byte stored in a multibit output register 118. In one exemplary embodiment, the operation is timed such that the time to shift one bit into a first charge-storage bank is substantially equal to a time to convert one bit-line of a previously received second input data byte.

The MAC core 100 further includes a controller 120 coupled to the first and second charge-storage banks 114a, 114b, in each accumulator 112, the controller configured to switch or exchange the first charge-storage bank 114a with the second charge-storage bank 114b after all bit of the number of first input data bytes has been accumulated in the first charge-storage bank and the charges in the second charge-storage bank have been converted. By switch or exchange it is meant the first charge-storage bank 114a in each accumulator 112 coupled to a shared bit-line 106 in a column in the memory array 102 is decoupled from the shared bit-line or memory array and coupled to the number of ADCs 116 for charge/voltage conversion, while the second charge-storage bank 114a is substantially simultaneously decoupled from the number of ADCs, and coupled to the shared bit-line in the memory array 102 for charge accumulation. In some embodiments, such as that shown, the controller 120 is included in the MAC core 100, and can be either integrally fabricated on a common or shared substrate with other elements of the MAC core, or packaged in shared integrated circuit package or attached to a common or shared circuit board with other elements of the MAC core. Alternatively, the controller 120 can be a controller in one of the ADCs 116, or a micro-control unit (MCU) or a processor in a hardware accelerator including the MAC core 100, or in a system in which the hardware accelerator is used.

Generally, the number of ADCs 116 is in the MAC core 100 is chosen such that the ADCs complete the conversion of all charges stored in each of the second charge-storage banks 114b during the time bits of the first input data bytes are shifted into each row of the memory array 102, and scaled charges for each bit are accumulated in the first charge-storage banks 114a. It is noted that although the conversion of accumulated charges stored in the plurality of second charge-storage banks 114b begins on substantially on the same first clock cycle as the shifting of bits of the input data bytes and accumulation of scaled charges the first charge-storage banks 114a, the time or number of clock cycles required for the reading of shared bit-lines 106 need not be the same as for conversion of all charges stored in each of the second charge-storage banks 114b. If the time it takes to read one bit-line current is equal to an ADC conversion time, then while the 8-bit scaled current is accumulated in the first charge-storage bank 114a for each shared bit-line 106, then a single 8-bit ADC 116 is sufficient for conversion of the charge from the previous input data bytes stored in a second charge-storage banks 114b and the number of ADCs 116 is equal to or greater than n/b rounded up to the nearest whole number, where n is the columns in the memory array 102, and b is a number of bits in the input data bytes. If however more time is needed to shift and accumulate in the first charge-storage bank 114a scaled charge for each bit read, for example if the charge-storage time per shared bit-line takes twice the amount of time or number of clock cycles needed for the ADC conversion, then the number of ADCs 116 can be reduced by half as one ADC can be time multiplexed to perform conversion on twice the number of bit-lines 106 or columns, thereby reducing ADC area while maintaining efficient use and 100% throughput of the ADC.

Where the number of clock cycles needed for shifting and accumulating the input data bytes is a number (x) times larger than the number of clock cycles for converting voltages, and the MAC core 100 further includes a clock buffer 122 as shown to increase or a frequency of the clock signals supplied to the first and second charge-storage banks 114a, 114b, and the number of ADCs 116.

Generally, as in the embodiment shown in FIG. 1A each memory cell 104 in the memory array 102 includes one multi-level, non-volatile memory (NVM) device or transistor on which the weight (an analog equivalent to the multiple levels of values that can be stored in the NVM cell) in each memory cell is stored. In another embodiment, shown in FIG. 1B, each memory unit 104 in the memory array 102 can have two NVM devices or NVM transistors, including first NVM cell coupled to a first bit-line 106a represented by sub-column P, and a second NVM cell coupled to a second bit-line 106b represented by sub-column N. In this embodiment, the programming values or weights into each memory cell 104 in the memory array 102 can include programming the first NVM devices in sub-column P, and second NVM cells in sub-column N with different values or different weights stored in each of the first and second NVM devices comprise opposite polarities N and P. Also as shown in FIG. 1B in this embodiment the number of ADCs 116 can include differential ADCs having differential inputs coupled to the first and second bit-lines 106a, 106b.

Figure 2:
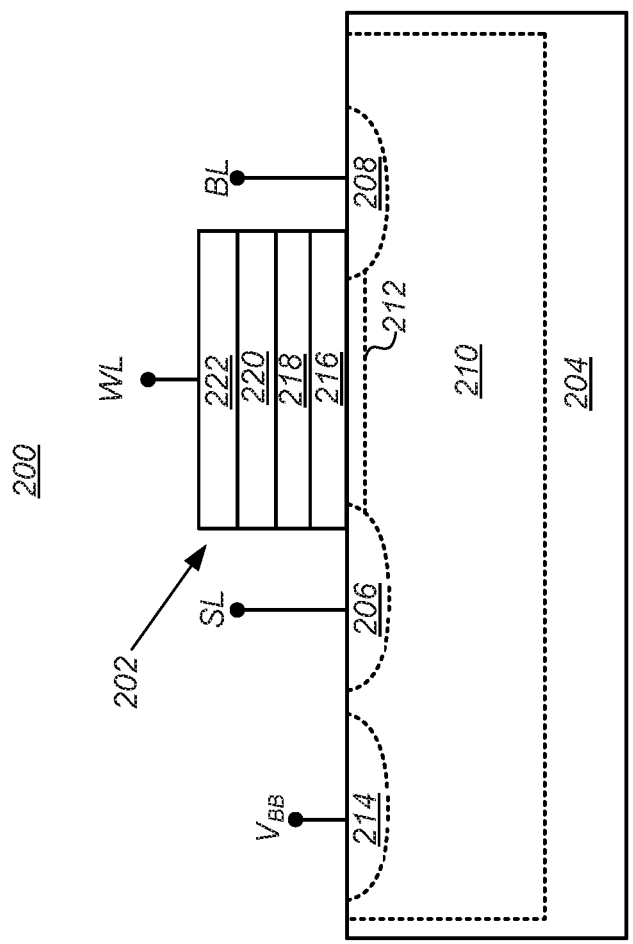
FIG. 2 is a block diagram illustrating a cross-sectional side view of an SONOS NVM transistor.

In either embodiment, multilevel, the NVM device can include a multilevel, silicon-oxide-nitride-oxide-silicon (SONOS) NVM transistor including one or more nitride or oxynitride charge-trapping layers, and capable of storing or trapping multiple levels of charge to shift a threshold voltage ($V_{TH}$) that must be applied to a wordline coupled to a gate of the ONO-type NVM transistor to turn on a transistor to program or store a program value or weight in the memory cell 104. FIG. 2 is a block diagram illustrating a cross-sectional side view of an SONOS NVM transistor. Referring to FIG. 2, a SONOS NVM transistor 200 includes a gate stack 202 formed over a substrate 204. The NVM transistor 200 further includes source/drain regions 206/208 formed in a well 210 in the substrate 204 on either side of gate stack 202, a channel region 212 underneath gate stack, and a body bias terminal 214, also referred to as a well terminal or a bulk terminal, to form an ohmic contact with the well 210. The source region 206, drain region 208, channel region 212 and body bias terminal 214 are formed by implanting dopants of an appropriate type, depending whether the NVM transistor is a p-type or an n-type, by ion implantation or by diffusion into the well 210. The well 210 also may be formed by ion implantation or by diffusion. The source region 206, drain region 208 and body bias terminal 214 may further include a thin layer of silicide, not shown in this figure, to form ohmic contacts with the regions in substrate 204.

The gate stack 202 includes an oxide tunnel dielectric layer 216, one or more nitride or oxynitride charge-trapping layers 218, a top, blocking oxide layer 220 and a polysilicon (poly), a silicided polysilicon or a metal layer which serves as a control gate 222.

When the control gate 222, source region 206, drain region 208 and body bias terminal 214 are appropriately biased, electrons from the source/drain/channel regions are injected or tunnel through tunnel dielectric layer 216 and are trapped in the charge-trapping layer 218. The mechanisms by which charge is injected can include both Fowler-Nordheim (FN) tunneling and hot-carrier injection. The charge trapped in the charge-trapping layer 218 results in an energy barrier between the drain and the source, raising the threshold voltage $V_T$ necessary to turn off the NVM transistor 200 putting the transistor in a "programmed" state. The NVM transistor 200 can be "erased" or the trapped charge removed and replaced with holes by applying an opposite bias on the control gate 222. The source region 206, drain region 208 and body bias terminal 214 are biased to alter a multi-level threshold voltage ($V_{TH}$) or cell current (partially program or partially erase the NVM transistor 200) to represent an analog stored weight value.

Multilevel SONOS-type NVM transistors are described, for example, in commonly assigned co-pending U.S. patent application Ser. No. 16/827,948 filed Mar. 24, 2020, which is incorporated by reference herein in its entirety.

In operation of the MAC core 100 shown in FIG. 1A or FIG. 1B input data bytes stored in the registers 110 are shifted into the memory array 102 in a bit wise manner, beginning with the most significant bit (MSB) first. Each row of the memory array 102 is provided with different or same input data bytes. These input data bytes can represent, for example, input image pixels or activations in a real-life convolutional neural network (CNN) application. If the shifted bit is 1, the corresponding memory cell 104 in the row gets turned ON, or selected for a read operation, and will provide a cell current equivalent to or representative of the programmed value of the respective memory cell, and if the bit is 0 the memory cell is not turned ON, or unselected for a read operation, and no current is forced into the associated shared bit-line 106. When memory cells 104 in several rows in a column are simultaneously activated in the above fashion, the shared bit-line 106 associated with the column carries a sum total of the cell currents from memory cells of the same column. The bit-line currents accumulated in the first or second charge-storage bank 114a, 114b, coupled to the shared bit-line are scaled in the charge-storage bank using a structure and method described below based on a weight associated with the bit of input data byte.

Referring to FIG. 1A, consider where the number of rows (m) and the number of columns (n) are both equal to 4 to form a 4×4 memory array. The programmed values or weights stored in a first row are W00, W01, W02, and W03. Weights stored in a second row are W10, W11, W12, and W13. Weights stored in the third row are W20, W21, W22, and W23, and weights stored in the fourth row are W30, W31, W32, and W33.

Following the procedure described above, an 8 bit, input data byte P0<D7:D0>, is sequentially shifted into the first row of the array 102, while concurrently a second 8 bit, input data byte P1<D7:D0>, is sequentially shifted into the second row, a third 8 bit, input data byte P2<D7:D0>, is sequentially shifted into the third row, and a fourth 8 bit, input data byte Pm or P3<D7:D0>, is sequentially shifted into the fourth row. Thus, at the end of eight clock cycles the shared bit-line 106 of the first column, into which the each of the bits input data bytes have been sequentially shifted beginning with the MSB of each input data byte, will have an effective current of:

$2^7$*(W00*P0<D7>+W10*P1<D7>+W20*P2<D7>+ W30*P3<D7>)+
$2^6$*(W00*P0<D6>+W10*P1<D6>+W20*P2<D6>+ W30*P3<D6>)+
$2^5$*(W00*P0<D5>+W10*P1<D5>+W20*P2<D5>+ W30*P3<D5>)+
$2^4$*(W00*P0<D4>+W10*P1<D4>+W20*P2<D4>+ W30*P3<D4>)+
$2^3$*(W00*P0<D3>+W10*P1<D3>+W20*P2<D3>+ W30*P3<D3>)+
$2^2$*(W00*P0<D2>+W10*P1<D2>+W20*P2<D2>+ W30*P3<D2>)+
$2^1$*(W00*P0<D1>+W10*P1<D1>+W20*P2<D1>+ W30*P3<D1>)+
$2^0$*(W00*P0<D0>+W10*P1<D0>+W20*P2<D0>+ W30*P3<D0>)

Similarly, the second column into which the each of the bits input data bytes have also been simultaneously and sequentially been shifted beginning with the MSB of each input data byte, will have an effective current of:

$2^7$*(W01*P0<D7>+W11*P1<D7>+W21*P2<D7>+ W31*P3<D7>)+
$2^6$*(W01*P0<D6>+W11*P1<D6>+W21*P2<D6>+ W31*P3<D6>)+
$2^5$*(W01*P0<D5>+W11*P1<D5>+W21*P2<D5>+ W31*P3<D5>)+
$2^4$*W01*P0<D4>+W11*P1<D4>+W21*P2<D4>+ W31*P3<D4>)+
$2^3$*(W01*P0<D3>+W11*P1<D3>+W21*P2<D3>+ W31*P3<D3>)+
$2^2$*(W01*P0<D2>+W11*P1<D2>+W21*P2<D2>+ W31*P3<D2>)+
$2^1$*(W01*P0<D1>+W11*P1<D1>+W21*P2<D1>+ W31*P3<D1>)+
$2^0$*(W01*P0<D0>+W11*P1<D0>+W21*P2<D0>+ W31*P3<D0>)

The effective current for the third and fourth columns would be similar, differing only by the different weights or programmed values for each column, that is weights of W02, W12, W22 and W32 for the third column, and weights of W03, W13, W23 and W33 for the fourth column.

Converting each of these bit-line currents into an equivalent digital value provides an effective MAC value of P0*W00+P1*W10+P2*W20+P3*W30 for the first column, P0*W01+P1*W11+P2*W21+P3*W31 for the second column, P0*W02+P1*W12+P2*W22+P3*W32 for the third column, and P0*W03+P1*W13+P2*W23+P3*W33 for the fourth column.

Figure 3:
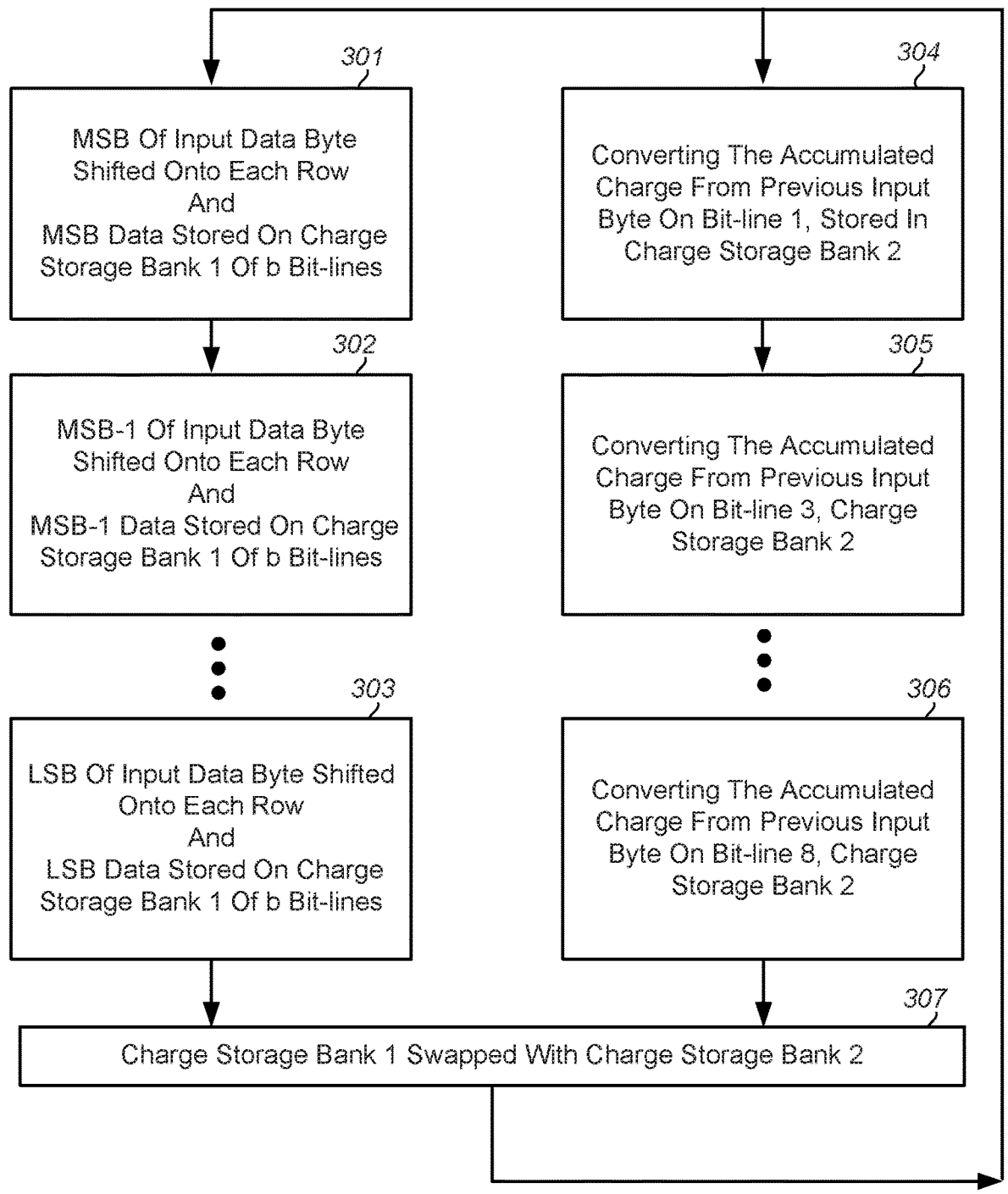
FIG. 3 is a flowchart of a method for performing MAC operations using the MAC core of FIG. 1A or 1B.

A method for performing MAC operations using a MAC core similar to that of FIG. 1A will now be described with reference to the flowchart of FIG. 3. It is noted that although overall sequences shown on the right and left side of this figure are performed concurrently or simultaneously, each of the separate and distinct steps shown on the right side need not occur substantially in parallel with any of the steps on the left side. For example, because conversion by the ADCs coupled to the second charge-storage bank can be performed more rapidly or slowly than accumulation of bits on the first charge-storage bank, the conversion of a first bit-line charges stored in second charge-storage bank need not overlap exactly with the accumulation of a first bit on the first charge-storage bank. Thus, the conversion of first bit-line charges from the second charge-storage bank can be completed and conversion of second or subsequent bit-line charges begun before accumulation of charge resulting from a most significant bit (MSB) on the first charge-storage bank is completed.

In a first phase charges for each bit of a number of input data byte of b bits (in this example b=8) are accumulated and stored in a first charge-storage bank from a most significant bit (MSB) to a least significant bit (LSB) in b, or 8, clock cycles. Referring to FIG. 3 the method begins in a first clock cycle with shifting a MSB of each of the input data bytes on to each row of the memory array and storing the resultant MSB data in the first charge-storage bank (301). Shifting the MSB of each of the input data bytes on to each row of the memory array activates each memory cell in the row based on a state of the bit, i.e., activating the memory cell when the shifted bit is a '1', multiplying the bit with a weight stored in each memory cell, by activating each memory cell to produce a weighted bit-line current proportional to a product of the bit and the weight stored therein. The weighted bit-line currents from each activated memory cell in each column are coupled to the shared bit-line in the column producing summed weighted bit-line current for each column, which are then converted to (scaled charges and accumulated on a charge-storage element or capacitor in the first charge-storage bank in a manner described below with reference to FIGS. 4 and 5. Generally, the first and second charge-storage bank include a number of sampling or bit-line capacitors equal to or greater than the number of bits in the input data bytes, and data or charge from each bit is accumulated in a separate one of the bit-line capacitors. Each of the bit-line capacitors have a different capacitance and data resulting from each bit is accumulated on a bit-line capacitor selected in relation to a significance of the bit in the input data byte. Thus, where the first bit shifted into each row is the MSB of the first input data byte coupled to the row charges produced by a sum of the weighted bit-line currents from the MSB bits are accumulated on a bit-line capacitor in the first charge-storage bank having the greatest capacitance.

In a second clock cycle the next most significant bit (MSB-1) of each of the input data bytes is shifted on to each row of the memory array and the resultant MSB-1 data stored in the first charge-storage bank (302). Again as with the shifting of the MSB into the array and accumulation of the resultant MSB data, each memory cell in a row is activated based on a state of the bit, effectively multiplying the bit with a weight stored in each memory cell to produce a weighted bit-line current proportional to a product of the bit and the weight stored therein, which are then converted to charges and accumulated on a charge-storage element or capacitor in the first charge-storage bank having a next greatest capacitance. The process continues by sequentially shifting one bit of each of the first input bytes into each row in the array on each successive clock cycle until the least significant bit of each of the first input bytes is shifted on to each row of the memory array and the resultant LSB data stored in the first charge-storage bank on a charge-storage element or capacitor having a least capacitance (303).

Simultaneously or substantially concurrently with the shifting of bits of the first input data bytes and the storing or accumulation of the resultant data, the accumulated charge from a previous, second input data bytes stored on the plurality of second charge-storage banks is converted from analog value to multibit, digital output data bytes using a number of ADCs coupled to the second charge-storage banks.

Referring again to FIG. 3 in a first conversion step following the same first clock cycle of step 301, the charge accumulated from a previously received second input data bytes and stored in a second charge-storage bank coupled to a first bit-line in a first column of the array is converted (304). The conversion is accomplished using the number of ADCs and sequentially coupling each of the bit-line capacitors in the second charge-storage bank to an output node of the second charge-storage bank in a manner described in detail below with reference to FIGS. 4 and 5. Next, the charge accumulated from the second input data bytes and stored in a second charge-storage bank coupled to a second bit-line of the array is converted 305. The conversion continues with conversion of charges accumulated from the second input data bytes and stored in each of the plurality of second charge-storage banks coupled to sequential bit-line of the array until data accumulated from all bit-lines have been converted 306. In the above example, the number of bits (b) in each input data byte accumulated and stored in the first and second charge-storage banks is equal to eight (8). Thus, the last of the plurality of second charge-storage banks from which accumulated charge is converted is that coupled to bit-line 8 in an eighth column of the array, and one ADC may be adequate to perform conversion for all eight bit-lines.

Finally, in a second phase, the coupling of the charge-storage banks is swapped or exchanged (307), and the ADC starts conversion of charge stored in the first charge-storage bank during the first phase, while the second charge-storage bank starts to accumulate and store charge for the next input data bytes. By swapped or exchanged it is meant the first charge-storage bank is decoupled from the memory array and coupled to the number of ADCs, and the second charge-storage bank is decoupled from the number of ADCs, and coupled to the memory array.

Again, it is noted that although the conversion of accumulated charges stored in the plurality of second charge-storage banks described in steps 304 through 306 begins on substantially on the same first clock cycle as the shifting and accumulation of MSB input data in step 301, the time (number of clock cycles) required for the reading of memory cells described in steps 301 to 303 above need not be the same. The assumption made in the exemplary method shown in FIG. 3 is that the charge-storage time per bit of input bytes and the ADC conversion time per bit-line is substantially equivalent. If the time it takes to shift one bit of the input bytes is equal to an ADC conversion time of one bit-line, then while the 8-bit scaled current is accumulated in the first charge-storage bank for each bit-line, then a single ADC would have completed conversion of the charge from the previous input data bytes stored in a plurality of second charge-storage banks, each coupled to one of the 8 bit-lines of the array. If however more time is needed the charge-storage time per bit, for example if the charge-storage time per bit takes twice the amount of time or number of clock cycles needed for the ADC conversion of one bit-line, then the number of ADCs can be reduced by half as one ADC can be multiplexed to perform conversion on twice the number of bit-lines or columns, thereby reducing ADC area while maintaining efficient use and 100% throughput of the ADC.

Figure 4A:
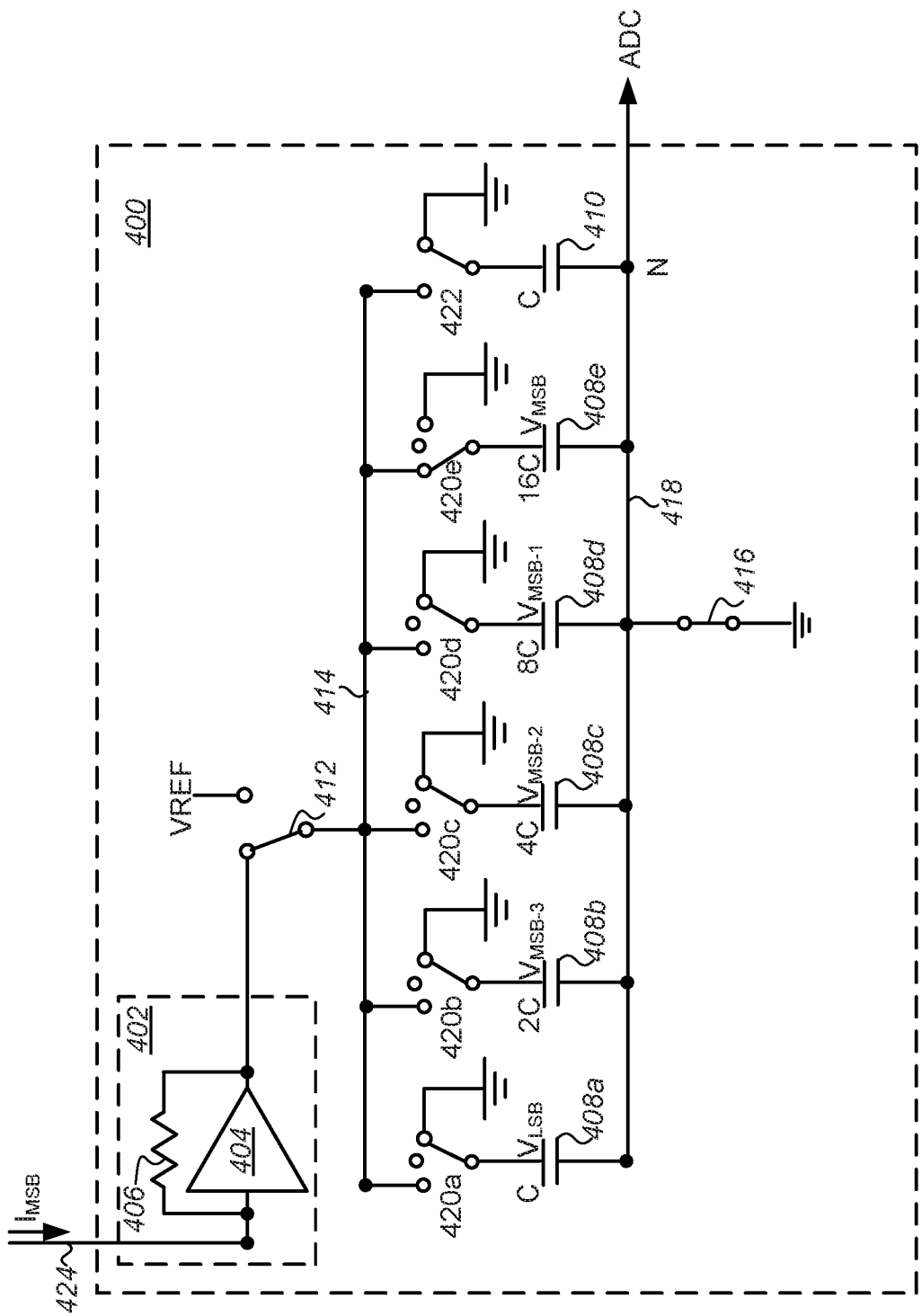
FIG. 4A is a schematic block diagram of an embodiment of a charge-storage bank for use in the MAC core of FIGS. 1A and 1B, and configured to sample current in a column resulting from a first bit of input data bytes shifted on to each row and store a resulting charge on a charge-storage element in the charge-storage bank.

A charge-storage bank suitable for use in a MAC core 100, such as those shown in FIGS. 1A and 1B will now be described with reference to the schematic block diagram of FIG. 4A. Referring to FIG. 4A the charge-storage bank 400 generally includes a current-to-voltage (I-to-V) converter 402, such as an operational amplifier 404 including a feedback resistor 406, to convert summed bit-line currents from activated memory cells in a column in the array to which the charge-storage bank is coupled, and a number of charge-storage elements charge, such as sampling or bit-line capacitors 408a-e, for sampling or accumulating a charge generated or produced by the summed bit-line currents. Generally, the number of sampling capacitors 408a-e is equal to or greater than a number of bits (b) expected in the multibit input bytes. Thus, in the embodiment shown in FIG. 4A the charge-storage bank 400 is particularly suited for accumulating and converting five (5) bit input bytes, and includes five (5) sampling capacitors 408a-e. The charge-storage bank 400 also includes a dummy capacitor ($C_{dummy}$ 410) coupled to an output node N of the charge-storage bank onto which all charges stored on the sampling capacitors 408a-e can be redistributed to derive or provide a voltage equivalent for scaling voltages for charges stored on each sampling capacitors prior to analog-to-digital conversion with elements or circuits of an ADC (not shown in this figure).

As noted above, each sampling capacitor 408a-e has a different capacitance selected to scale a voltage associated with each bit of the input data byte. For example in the embodiment shown, bit-line current ($I_{MSB}$) from a column into which the most significant bit (MSB) of the input data bytes are shifted is converted to a voltage ($V_{MSB}$) and stored or accumulated as charge on a sampling capacitor 408e having a capacitance 16C. The voltage stored or accumulated next most significant bit ($V_{MSB-1}$) is stored on sampling capacitor 408d having a capacitance 8C, $V_{MSB-2}$ is stored on sampling capacitor 408c having a capacitance 4C, $V_{MSB-3}$ is stored on sampling capacitor 408b having a capacitance 2C and $V_{LSB}$ is stored on sampling capacitor 408a having a capacitance C.

In addition to the above the charge-storage bank 400 further includes a first switch 412 through which a first or input bus 414 is coupled either to an output of the I-to-V converter 402, or to a reference voltage ($V_{REF}$), and a second switch 416 through which a second or output bus 418 can be coupled to ground while accumulating charges generated by the summed bit-line currents stored on each of the sampling capacitors 408a-e. First or top plates of each of the sampling capacitors 408a-e are individually coupled to the input bus 414 through independent switches 420a-e to allow charges for each bit in the input data bytes to be accumulated on one of the sampling capacitors 408a-e individually rather than on all sampling capacitors simultaneously as in conventional SAR ADCs. Second or lower plates of each of the sampling capacitors 408a-e, are coupled in parallel with each other and a lower plate of the dummy capacitor 410 to the output bus 418. A top plate of the dummy capacitor 410 is coupled to the input bus through a switch 422. Switches 420a-e are turned on sequentially to charge each of the sampling capacitors 408a-e when an input to the I-to-V converter 402 is coupled to a shared bit-line 424 in a column in the memory array receiving current from a bit-line corresponding to the specific bit of the input data byte stream. The switches 412, 416, 420a-e and 422 are controlled or operated by a controller (not shown) in or coupled to the MAC core.

Figure 5:
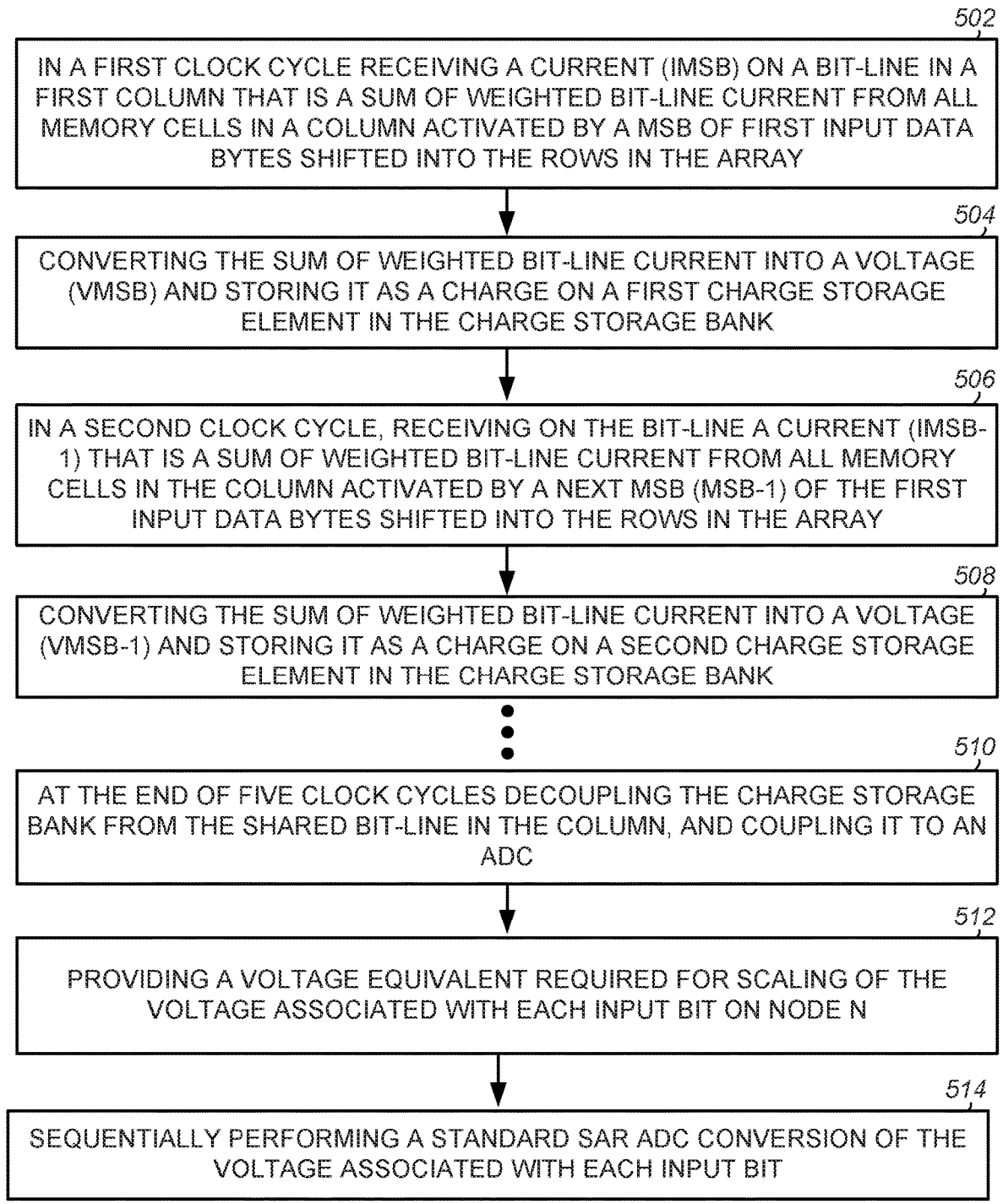
FIG. 5 is a flow chart is a flowchart of a method for operating a single charge-storage bank coupled to a single bit-line to accumulate current resulting from shifting of input data bytes into each row, perform MAC operation on all bits of the input data bytes and to convert charges resulting from a MAC operation on all bits of the input data bytes into an output data byte.

FIG. 5 is a flow chart is a flowchart of a method for operating a single charge-storage bank coupled to a single bit-line to accumulate current resulting from shifting of input data bytes into each row, perform MAC operation on all bits of the input data bytes and to convert charges resulting from a MAC operation on all bits of the input data bytes into an output data byte. It will be understood that while the following method is described with reference to a single charge-storage bank coupled to a single bit-line, that in actual operation of a MAC core including first and second charge-storage banks coupled to each bit-line in a column of an array including multiple columns, such steps are performed concurrently or simultaneously in each of the plurality of first and second charge-storage banks coupled to each bit-line in the array.

Figure 4B:
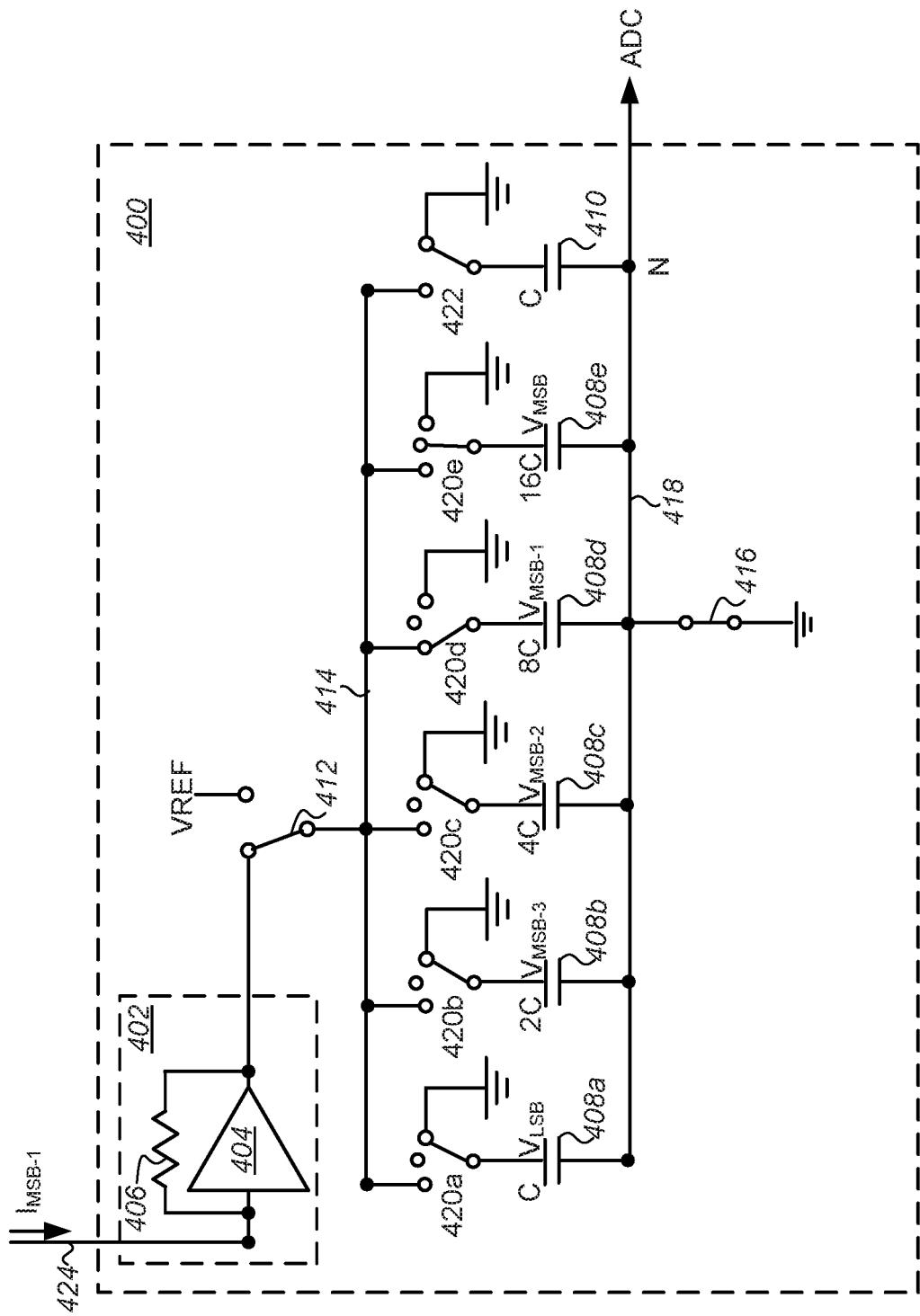
FIG. 4B is a schematic block diagram of the charge-storage bank of FIG. 4A configured to sample current in the column resulting from a second bit of the input data bytes and store the resulting charge on a second charge-storage element in the charge-storage bank.
Figure 4C:
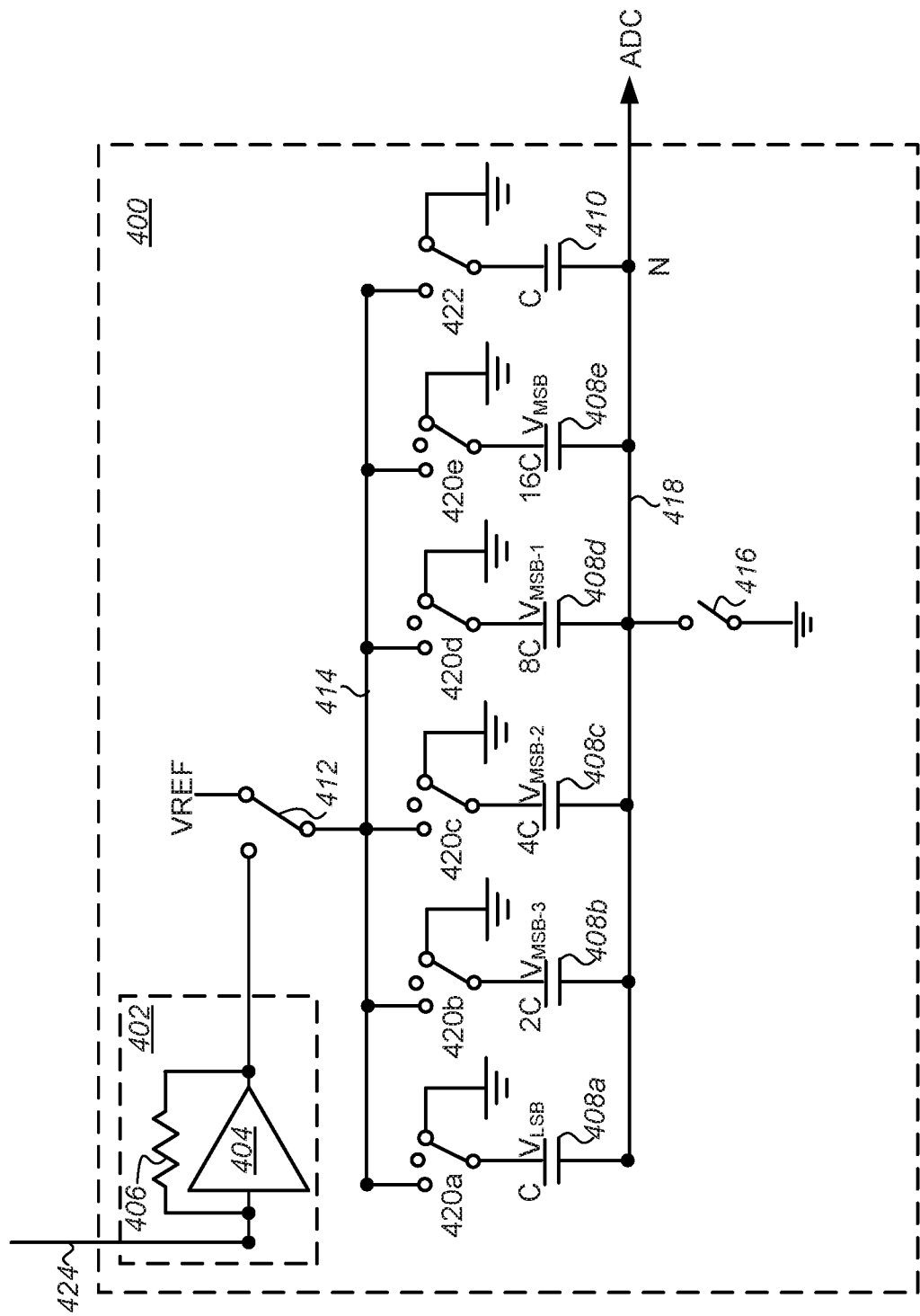
FIG. 4C is a schematic block diagram of the charge-storage bank of FIG. 4A configured to hold charges resulting from all bits of the input data bytes and to provide on node N a voltage equivalent required for scaling of the voltage associated with each input bit.

Referring to FIG. 5, the method begins in a first phase at a first clock cycle with receiving a current ($I_{MSB}$) on a bit-line in a first column that is a sum of weighted bit-line current from all memory cells in the first column activated by a MSB of first input data bytes shifted into the rows in the array and coupled to a charge-storage bank (502). Next, the sum of weighted bit-line current is converted into a voltage ($V_{MSB}$) and stored as a charge on a first charge-storage element in the charge-storage bank (504). Referring to FIG. 4A this is accomplished by converting the current into a voltage using I-to-V converter 402, closing switch 412 to couple the input bus 414 to an output of the I to V converter 402, closing switch 416 to couple the output bus 418 to ground, and closing switch 420e to couple accumulated charge on a first capacitor 408e. In a second clock cycle, a next MSB (MSB-1) of first input data bytes is shifted into the rows in the array and a sum of weighted bit-line current ($I_{MSB-1}$) from all activated memory cells in the column coupled to the charge-storage bank (506). The sum of weighted bit-line current produced from the next MSB is converted into a voltage ($V_{MSB-1}$) and stored as a charge on a second charge-storage element in the charge-storage bank (508). Referring to FIG. 4B this is accomplished by opening switch 420e and closing switch 420d, to accumulate charge on a second capacitor 408d. The process continues sequentially in a similar manner until weighted bit-line current produced by all bits in the first input data bytes is received and stored on individual capacitors 408a-e in the charge-storage bank 400. Referring to FIG. 4C the accumulated charges resulting from all bits of the input data bytes can then be held in the charge-storage by connecting the input bus 414 through first switch 412 to a reference voltage (VREF), opening switch 416 and switching all switches 420a-e to ground. In one alternative embodiment, instead of the MSB first approach, LSB may be shifted in the first clock cycle, followed by LSB+1 until weighted bit-line current produced by all bits in the first input data bytes is received and stored on individual capacitors 408 e-a in the charge-storage bank 400.

Figure 4D:
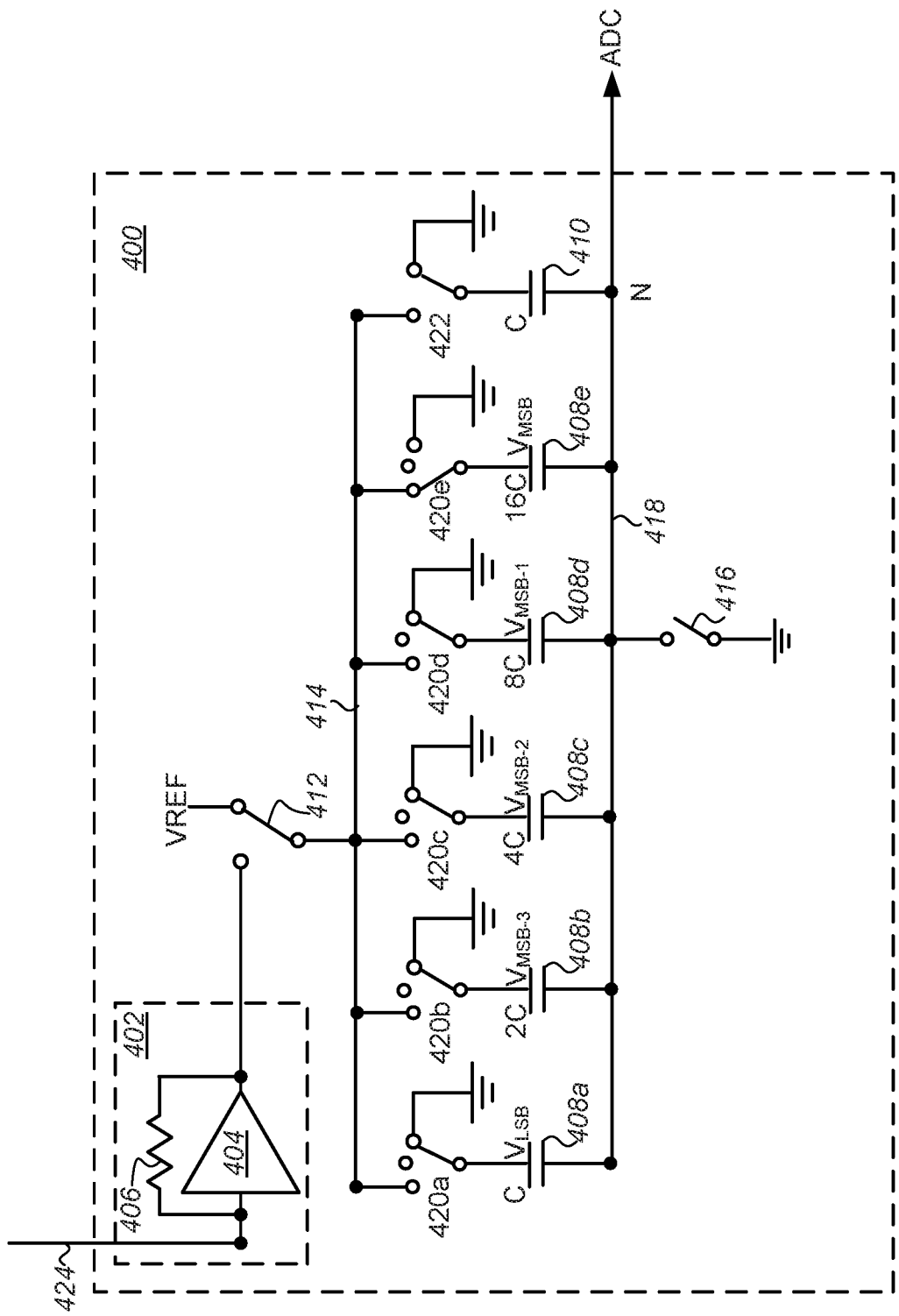
FIG. 4D is a schematic block diagram of the charge-storage bank of FIG. 4A configured to convert charges resulting from a MAC operation on all bits of the input data bytes into an output data byte a using successive approximation register analog to digital converter (SAR ADC)

At the end of five (5) clock cycles the charge-storage bank is decoupled from the shared bit-line in the column, and coupled to an ADC at or through node N (510). Next, a voltage equivalent required for scaling of the voltage associated with each input bit is provided on node N (512). Referring to FIG. 4C this can be accomplished by closing all switches 420a-e and switch 422 to couple the top plates of all sampling capacitors 408a-e to dummy capacitor 410 to ground to redistribute charges thereon. Next, a standard SAR ADC conversion of the voltage associated with each input bit and stored on each sampling capacitor 408a-e is performed sequentially (514). Referring to FIG. 4D this can be accomplished by forcing VREF voltage onto the top plate of capacitor 408e, by turning the switch 420e to VREF, which will generate a voltage of VREF/2−Vin on node N (Vin here is the equivalent scaled voltage of all the charge stored on capacitors 408a through 408e in the sampling phase across all the input bits in the input byte). The ADC makes a decision of the MSB bit based on the voltage seen on the node N. From then on the normal SAR controller operation follows. I.e., based on the MSB bit decision the SAR controller decides to either sample VREF/4 or 3*VREF/4 to node N and so on.

Figure 6:
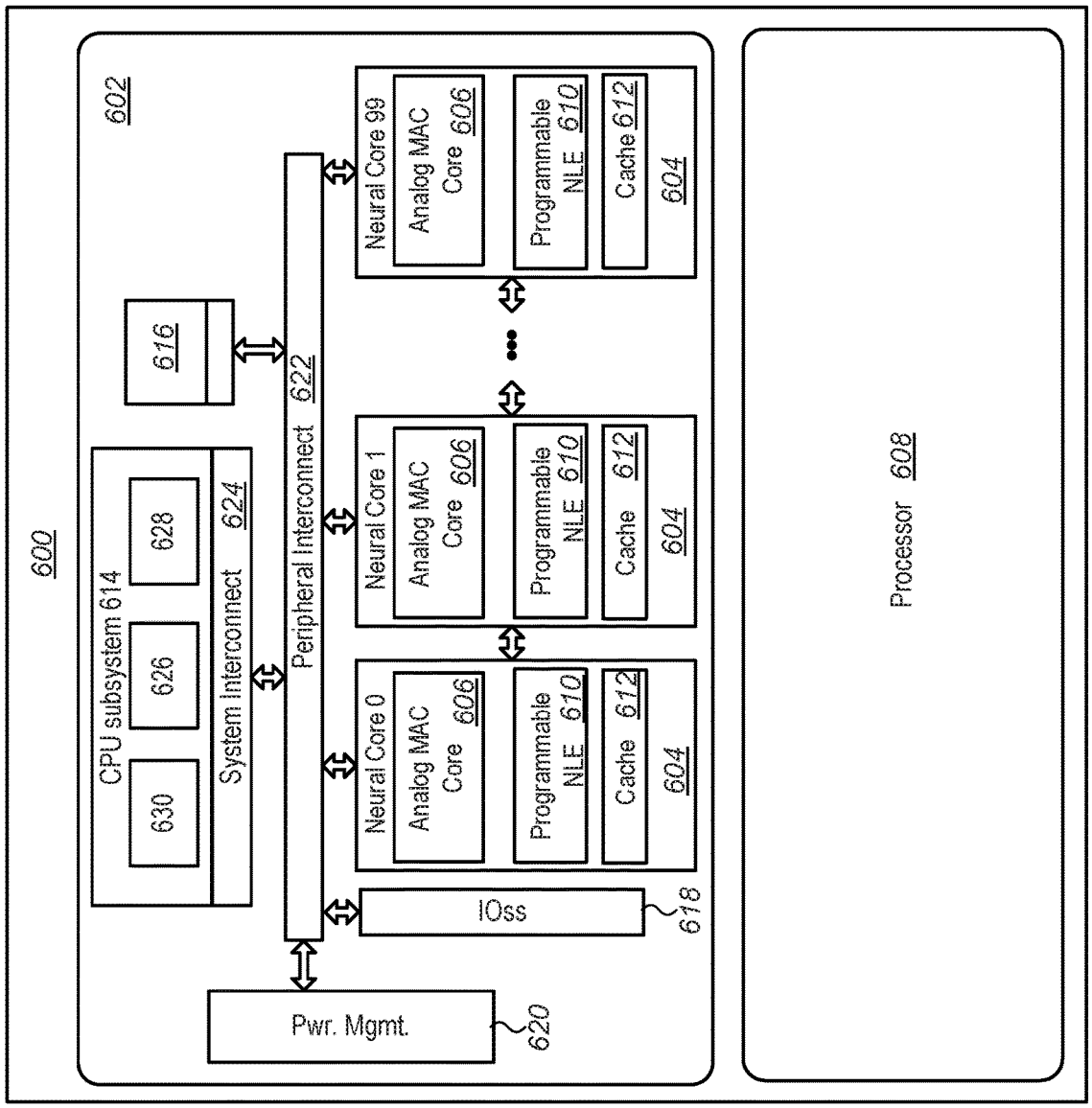
FIG. 6 is a schematic block diagram of an embodiment of an artificial intelligence (AI) system with a hardware accelerator including a number of neural engines with MAC cores operated in accordance with the present disclosure.

FIG. 6 is a schematic block diagram of an embodiment of an artificial intelligence (AI) system 600 with a hardware accelerator 602 including a number of neural engines or cores 604, each with a MAC core 606 having IMC architecture and operated in accordance with the present disclosure. Referring to FIG. 6, the system includes addition to the hardware accelerator 602 a microcontroller or processor 608. The processor 608 can include or be implemented as a system-on-chip (SOC), a field programmable gate array (FPGA), an application specific integrated circuit (ASIC) or micro-control unit (MCU), and depending on a complexity of the AI system 600 and in particular of the processor can be integrally formed on a common or shared substrate with the hardware accelerator 602 or elements of the hardware accelerator, or packaged in shared integrated circuit package or attached to a common or shared circuit board with the hardware accelerator.

In addition to the MAC core 606 each neural core 604 generally further includes a programmable non-linear engine (NLE) 610 to do non-linear activation functions on the MAC output, and a cache 612 including random access memory (RAM) or static random access memory (SRAM).

In addition to the neural cores 604 the hardware accelerator 602 generally further includes an AI coprocessor 614, such as a central processing unit (CPU) subsystem, a buffer 616 including RAM or SRAM, an input/output subsystem (IOSS 618), and a system resources sub-system (SRSS 620), all electrically coupled through a peripheral interconnect 622 and/or a system interconnect 624 in the AI coprocessor.

The AI coprocessor 614 generally includes firmware stored in a read only memory (ROM 626), RAM 628 or SRAM, and a processor 630 having a reduced instruction set computing (RISC) architecture or a commercially available Cortex M series processor from Arm Holdings.

In-Memory Computing (IMC) architectures including MAC cores with NVM memory arrays and dual charge-storage banks and methods for operating the same to improve the speed and efficiency of MAC operations have been disclosed. Advantages of the MAC core and MAC operation method include elimination of the need to consume additional power in scaling the input current according to the weight of input bits, and because the scaling voltage is produced from the same capacitors in the charge-storage bank, any charge leakage in the charge-storage banks would result in a gain error that can be accounted for at the system level. Thus, it will be understood that the MAC core and MAC operation method disclosed herein provides better power efficiency, and increased total operations per second (TOPS) and TOPS/Watt than could be achieved with similar prior art IMC architectures.

Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A method comprising:
    coupling each of a number of first input bytes to one of a plurality of rows in an array of memory cells arranged in rows and columns, each memory cell in a column coupled to a shared bit-line;
    sequentially shifting bits of the number of first input bytes into each memory cell in each row; and for each bit:
        multiplying the bit with a weight stored in each memory cell, by activating each memory cell based on a state of the bit to produce a weighted bit-line current from each activated memory cell proportional to a product of the bit and the weight stored therein;
        accumulating in first charge-storage banks, each coupled to the shared bit-line in one of the columns, charges produced by a sum of the weighted bit-line current from each activated memory cell in the column, wherein the charges accumulated are scaled in relation to a significance of the bit in the number of first input bytes; and
        concurrently with said shifting, multiplying, and accumulating, converting into an output byte charges produced by a sum of weighted bit-line currents from a number of second input bytes previously accumulated in second charge-storage banks using a number analog to digital converters (ADCs) coupled thereto.

2. The method of claim 1 wherein said shifting, multiplying, and accumulating are accomplished without converting bits of the number of first input bytes using a digital to analog converter.

3. The method of claim 1 further comprising exchanging the first charge-storage banks with the second charge-storage banks after bits of the number of first input bytes has been shifted and the charges accumulated in the first charge-storage banks and the charges in the second charge-storage banks have been converted.

4. The method of claim 1 wherein each of the first and second charge-storage banks comprise a plurality of bit-line capacitors comprising different capacitances, and wherein accumulating charges comprises accumulating charges produced on a column by each sequentially shifted bit on one of the plurality of bit-line capacitors having a capacitance selected in relation to a significance of the bit in the number of first input bytes.

5. The method of claim 4 wherein a first bit shifted into each row is a most significant bit (MSB) of the first input byte couple to the row, and wherein accumulating charges produced by the sum of the weighted bit-line current from the first bits in a column comprises accumulating charges on a bit-line capacitor in the first charge-storage banks having a greatest capacitance.

6. The method of claim 4 wherein each of the first and second charge-storage banks further comprise a dummy capacitor coupled to an output node thereof, and wherein converting charges previously accumulated in the second charge-storage banks comprises redistributing charges stored on the plurality of bit-line capacitors into the dummy capacitor to provide a voltage equivalent for scaling voltages associated with charges stored on each of the plurality of bit-line capacitors.

7. The method of claim 1 wherein each memory cell comprises a multi-level, non-volatile memory (NVM) device, and further comprising storing the weight in each NVM device prior to sequentially shifting bits of the number of first input bytes into each memory cell.

8. The method of claim 1 wherein each memory cell comprises two multi-level, non-volatile memory (NVM) devices, including a first NVM device coupled to the shared bit-line, and a second NVM device coupled to a second shared bit-line shared by second NVM devices in memory cells in the column, and further comprising storing different weights in each of the first and second NVM devices in the memory cell prior to sequentially shifting bits of the number of first input bytes into each memory cell.

9. The method of claim 8 wherein the different weights stored in each of the first and second NVM devices comprise opposite polarities.

10. A multiply-and-accumulate (MAC) core comprising:
an array of memory cells arranged in rows and columns, each memory cell in a column coupled to a shared bit-line;
a plurality of registers each coupled to one row of the array to sequentially shift bits of first input bytes into the row to activate the memory cells based on a state of the bit to produce a weighted bit-line current from each activated memory cell proportional to a product of the bit and the weight stored therein; and
a plurality of first charge-storage banks each coupled to the shared bit-line in one of the columns and configured receive a sum of weighted bit-line currents and to accumulate for each bit of the input bytes charge produced by the sum of weighted bit-line currents;
a plurality of second charge-storage banks coupled to a number of analog-to-digital converters (ADCs), each of the second charge-storage banks configured to concurrent with the shifting and accumulating, to provide scaled voltages for each bit of previously received second input bytes to the number of ADCs for conversion into an output byte; and
a controller coupled to the plurality of first and second charge-storage banks to switch the first charge-storage banks with the second charge-storage banks after each bit of the first input bytes has been accumulated in the first charge-storage banks and the charges in the second charge-storage banks have been converted.

11. The MAC core of claim 10 not including a digital to analog converter between the plurality of registers and the array.

12. The MAC core of claim 10 wherein each of the first and second charge-storage banks comprise a plurality of bit-line capacitors comprising different comprising different capacitances to accumulate charges produced on a column by each sequentially shifted bit on one of the plurality of bit-line capacitors having a capacitance selected in relation to a significance of the bit in the first input bytes.

13. The MAC core of claim 12 wherein each of the first and second charge-storage banks further comprise a dummy capacitor coupled to an output node thereof to redistribute charges stored on the plurality of bit-line capacitors into the dummy capacitor to provide a voltage equivalent to scale voltages associated with charges stored on each of the plurality of bit-line capacitors.

14. The MAC core of claim 10 wherein each memory cell comprises a multi-level, non-volatile memory (NVM) device on which the weight in each memory cell is stored.

15. The MAC core of claim 14 wherein each memory cell comprises two multi-level, non-volatile memory (NVM) devices, including a first NVM device coupled to the shared bit-line, and a second NVM device coupled to a second shared bit-line shared by second NVM devices in memory cells in the column, and wherein the first NVM device and the second NVM devices store different weights.

16. The MAC core of claim 10 wherein a time to accumulate in the first charge-storage banks a scaled charge generated from each bit of the first input bytes is greater than a time to convert charges in the second charge-storage banks, and wherein the number of ADCs are time multiplexed to perform conversion on charges in a plurality of second charge-storage banks.

17. An artificial intelligence (AI) system comprising:
a microcontroller; and
a plurality of multiply-and-accumulate (MAC) core, wherein each MAC core comprises:
an array of memory cells arranged in rows and columns, each memory cell including a non-volatile memory (NVM) device, and each column including a bit-line connecting NVM devices in the column;
a plurality of registers each coupled to one row of the array to sequentially shift bits of a first input byte into the row to activate the NVM devices based on a state of the bit to produce a weighted bit-line current from each activated NVM device proportional to a product of the bit and a weight stored therein; and
a plurality of first charge-storage banks, each coupled to the bit-line in one of the columns and configured receive a sum of weighted bit-line currents and to accumulate for each bit of the input bytes charge produced by the sum of weighted bit-line currents;
a plurality of second charge-storage banks coupled to a number of analog-to-digital converters (ADCs), each of the second charge-storage banks configured to concurrent with the shifting and accumulating, to provide scaled voltages for each bit of previously received second input bytes to the number of ADCs for conversion into an output byte; and
a controller coupled to the plurality of first and second charge-storage banks to switch the first charge-storage banks with the second charge-storage banks after each bit of the first input byte has been accumulated in the first charge-storage banks and the charges in the second charge-storage banks have been converted.

18. The system of claim 17 wherein each of the first and second charge-storage banks comprise a plurality of bit-line capacitors comprising different comprising different capacitances to accumulate charges produced on a column by each sequentially shifted bit on one of the plurality of bit-line capacitors having a capacitance selected in relation to a significance of the bit in the first input byte.

19. The system of claim 18 wherein each of the first and second charge-storage banks further comprise a dummy capacitor coupled to an output node thereof to redistribute charges stored on the plurality of bit-line capacitors into the dummy capacitor to provide a voltage equivalent to scale voltages associated with charges stored on each of the plurality of bit-line capacitors.

20. The system of claim 17 wherein each NVM device comprises a multi-level NVM device on which the weight in each memory cell is stored.

* * * * *